United States Patent [19]

Jennings et al.

[11] 4,360,792

[45] Nov. 23, 1982

[54] SEPARABLE MULTI-UNIT CRYSTAL NETWORK DEVICE

[75] Inventors: John D. Jennings, Andover; Walter E. Killerby, Lowell, both of Mass.; Robert L. Reynolds, Allentown, Pa.

[73] Assignee: Western Electric Company, Inc., New York, N.Y.; Bell Telephone Laboratories, Inc., Murray Hill, N.J.

[21] Appl. No.: 183,130

[22] Filed: Sep. 2, 1980

[51] Int. Cl.³ .................. H03H 9/05; H03H 9/15; H03H 9/58
[52] U.S. Cl. ........................ 333/189; 310/348; 333/187
[58] Field of Search ............... 333/187–192; 310/348, 352, 349–351, 311; 172/52 FP; 339/17 R, 17 M, 17 N; 29/25.35

[56] References Cited

U.S. PATENT DOCUMENTS

| | | | |
|---|---|---|---|
| 2,155,035 | 4/1939 | Bieling | 310/352 |
| 2,358,087 | 9/1944 | Lane | 333/189 |
| 4,066,317 | 1/1978 | Bierenfeld et al. | 339/91 R |
| 4,070,502 | 1/1978 | Vig et al. | 333/187 X |

*Primary Examiner*—Marvin L. Nussbaum
*Attorney, Agent, or Firm*—D. D. Bosben

[57] ABSTRACT

A crystal network device (10 or 200) includes a plurality of separable interconnected crystal resonator devices (12, 14, 16 and 18 or 202, 204 and 206) having different resonant frequencies. Each of the crystal resonator devices comprises a molded plastic support member (22, 68, 90, 142 or 208, 264, 283) having a plurality of unitary terminals (32, 120 or 222, 264, 292), which may be of J-shaped construction, mounted thereon. Each crystal resonator device (12, 14, 16, 18 or 202, 204, 206) also includes a crystal resonator plate (30, 84, 102, 150 or 224, 268, 298) mounted on a respective one of the support members (22, 68, 90, 142 or 208, 264, 283) by lead wires (54, 138 or 226, 270, 300) extending from the plate and bonded to enlarged wire terminating sections (48, 126 or 230, 274, 304) of the terminals (32, 120 or 122, 264, 292) so as to produce a free wire length of the lead wires on the order of an odd multiple of one-quarter wave length of the respective lead wires, when the lead wires are resonant at the resonant frequency of their respective crystal resonator plates. Legs (36, 122 or 218, 260, 290) of the terminals (32, 120 or 122, 264, 292) project from the crystal network device (10 or 200) for mounting and interconnecting the device on a printed circuit board (20 or 310).

18 Claims, 7 Drawing Figures

SEPARABLE MULTI-UNIT CRYSTAL NETWORK DEVICE

TECHNICAL FIELD

This invention relates to a crystal network device, and more particularly to a crystal network device which includes a plurality of separable interconnected crystal resonator devices.

BACKGROUND OF THE INVENTION

A discrete channel filter of a type used in communications transmission equipment requires a crystal network device which includes a plurality of elongated crystal resonator plates of different resonant frequencies connected in parallel. In a known crystal network device utilizing two sets of two of the crystal resonator plates, each crystal resonator plate is supported by four lead wires (two on each side of the plate) bonded to electrodes of the plate and soldered to individual conductive paths on a short thin section of printed wiring board, known as a "rail." A molded plastic holder includes shelves for supporting the rails, and further includes essentially planar, slightly tapered side fins which extend adjacent the crystal resonator plates to provide physical protection. Each set of the crystal resonator plates and its associated rails are mounted on the top and bottom sides of the molded plastic holder, respectively. The rails are attached by electrically conductive epoxy cement to terminal studs which are press-fitted into apertures in the holder, and which project from the holder for mounting the assembly on a printed circuit board and electrically connecting the crystal resonator plates to circuits on the board.

In the above-described crystal network device, each crystal resonator plate, together with its lead support wires and printed circuit board rails, forms a subassembly device which can be individually tuned. However, since the printed circuit board rails do not provide a fixed mounting structure until the rails are bonded to the terminal studs, measurements of the frequency of the subassembly made in intermediate stages of its fabrication may be inaccurate and subject to variations. Further, strain-free joints between the rails and the terminal studs are difficult to achieve because the electrically conductive epoxy cement used must be cured at an elevated temperature, and is subject to fracturing, causing electrical opens and/or other defects. In addition, since the crystal network device must be fabricated to form a non-separable structure before final test measurements of the device are made, a final device not meeting test requirements generally requires difficult and expensive repair, or may have to be scrapped in its entirety.

Accordingly, a purpose of this invention is to provide a crystal network device consisting of separate crystal resonator devices which can be pretested and then assembled to form a crystal network device having a rigid composite structure, with the resultant crystal network device being capable of ready disassembly, if necessary.

SUMMARY OF THE INVENTION

Briefly, a crystal network device includes an assembly of separable interconnected support members of electrical insulating material. A plurality of unitary electrical terminals are mounted on each support member with each terminal including a portion projecting beyond the assembly of interconnected support members adjacent one side of the assembly for mounting the assembly on a substrate and electrically connecting the crystal network device to circuits on the substrate. A crystal resonator plate for each of the support members is mounted thereon by lead wires which extend from the crystal resonator plate and which are fixedly bonded to the terminals mounted on the support member.

More specifically, a crystal network device includes a plurality of separable interconnected crystal resonator devices. Each crystal resonator device comprises a molded plastic support member which includes a first support portion, a second support portion projecting perpendicularly from the first support portion in a first direction, and a protective fin portion projecting from the first support portion in a second direction perpendicular to the first direction. Each crystal resonator device also includes a plurality of unitary electrical terminals which may be of essentially J-shaped construction, with each terminal having a bight portion, a relatively long leg projecting from one end of the bight portion and a relatively short leg projecting from the opposite end of the bight portion. The legs of the J-shaped terminals are disposed in apertures in respective ones of the first and second support portions with an interference fit, and the long legs of the terminals on certain of the support members extend through additional apertures in one or more of the other support members, with the long leg of each terminal also projecting from the assembly of interconnected support members adjacent one side of the assembly for mounting of the crystal network device on a substrate and electrically connecting the device to circuits on the substrate. Further, each crystal resonator device includes an elongated crystal resonator plate disposed in a slot between the first and second support portions of the support member of the device, and mounted on the terminals of the device by leads fixedly bonded to enlarged wire terminating sections of the terminals so as to define a free wire length of each lead on the order of an odd multiple of one quarter wave length of the lead, when the lead is resonant at the resonance frequency of the crystal resonator plate.

DETAILED DESCRIPTION

Figure 1:
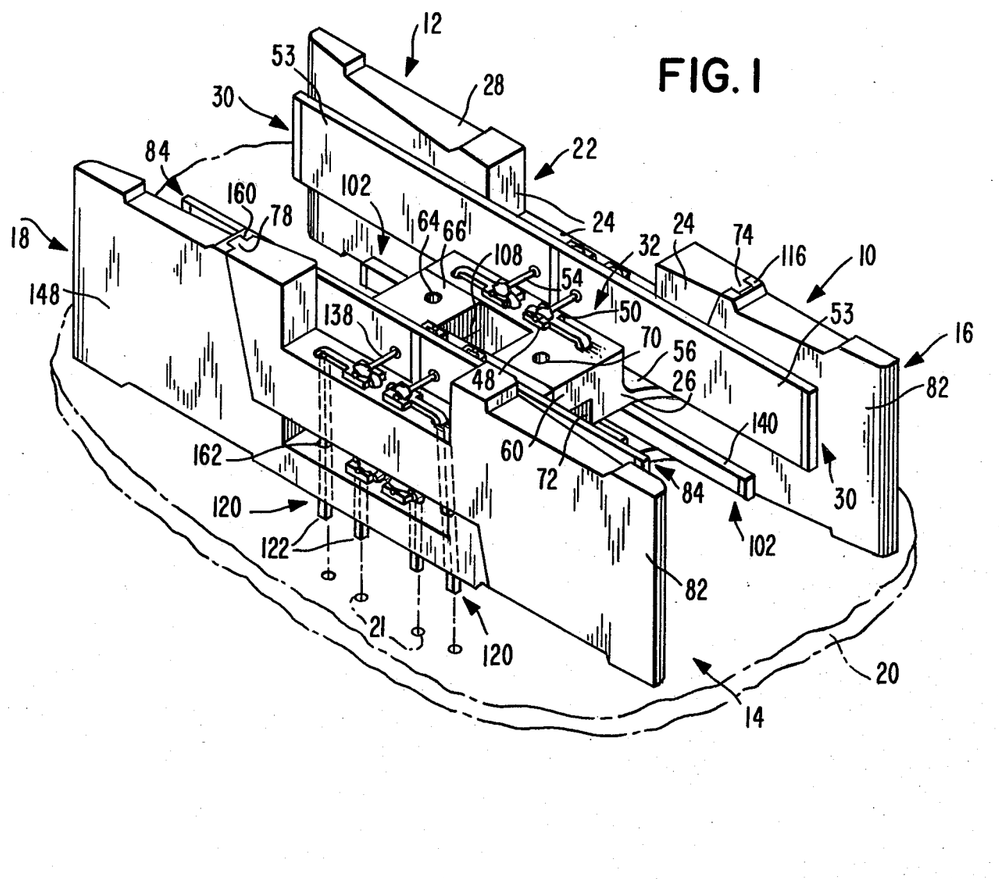
FIG. 1 is an isometric view of a crystal network device in accordance with this invention.

Referring to FIG. 1, the disclosed embodiment of the invention is directed to a crystal network device 10 which includes four crystal resonator devices 12, 14, 16 and 18 of different resonant frequencies. The crystal resonator devices 12, 14, 16 and 18 are interconnected to one another, and are separable from one another if necessary, as for example, for replacement purposes. In use, the crystal network device 10 is mounted on a substrate 20 having apertures 21 and associated circuits (not shown) formed thereon in a known manner.

Figures 2, 3:
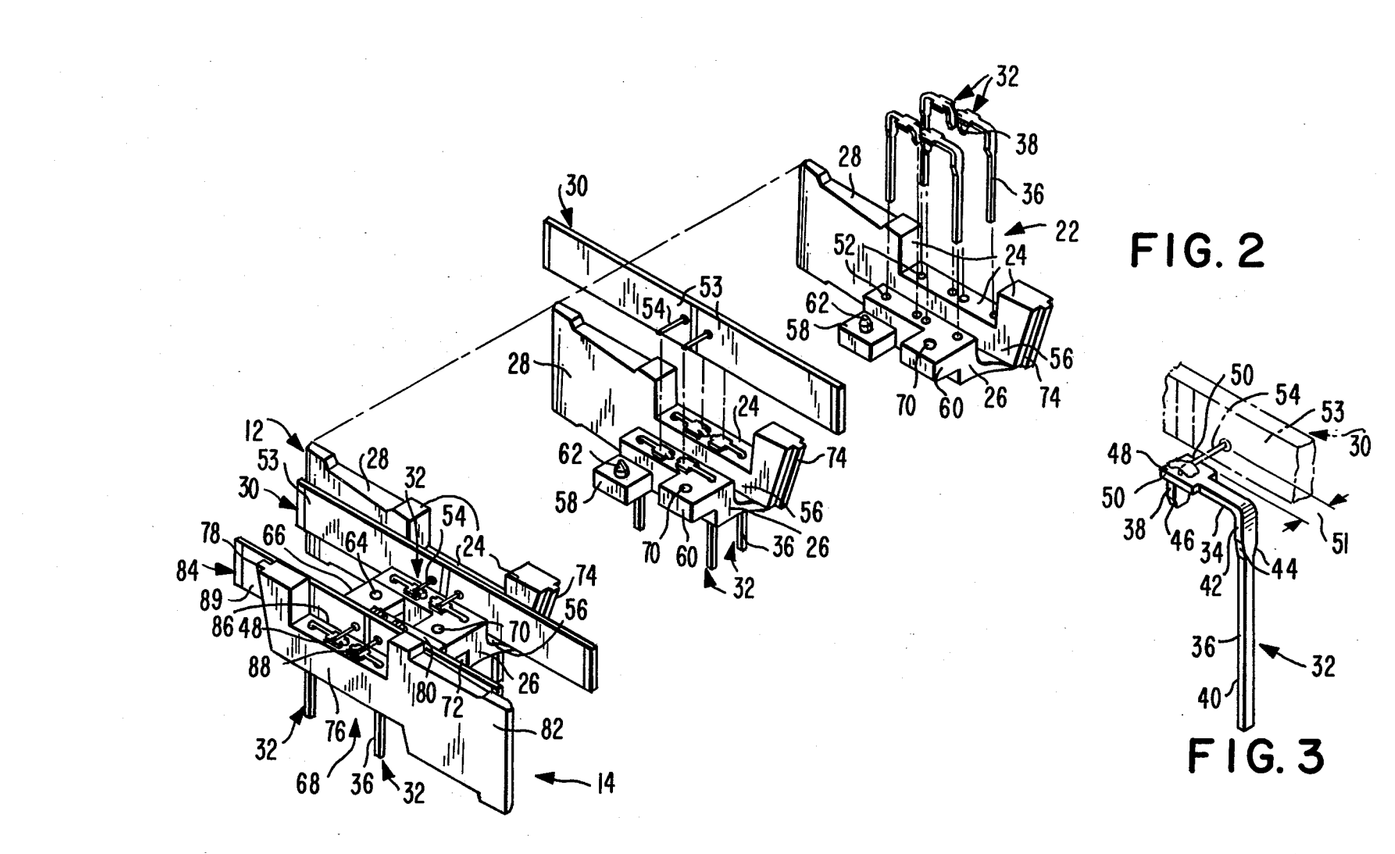
FIG. 2 is an isometric exploded view illustrating the assembly of one set of crystal resonator devices in accordance with this invention.
FIG. 3 is a partial isometric view illustrating a terminal in accordance with this invention.

Referring to FIG. 2, the first crystal resonator device 12 includes a support member 22 of a molded plastic material which includes an essentially U-shaped first resonator plate support portion 24 and a shelf-type second resonator plate support portion 26 projecting perpendicularly from the first support portion in a first direction, i.e., essentially forwardly in FIG. 2. The support member 22 also includes an essentially planar, slightly tapered fin-like portion 28 which projects from the first support portion 24 in a second direction perpendicular to the direction of projection of the second support portion 26, i.e., essentially to the left in FIG. 2, in protective relationship to an adjacent end of a crystal resonator plate 30.

The first crystal resonator device 12 also includes two pairs of unitary essentially J-shaped terminals 32 which are shown inverted as viewed in FIGS. 2 and 3. As is best shown in FIG. 3, each of the terminals 32 includes a bight portion 34, a relatively long leg 36 extending from one end of the bight portion and a relatively short leg 38 extending from an opposite end of the bight portion. The long leg 36 of each terminal 32 includes an outer portion 40 which is essentially square in cross-section, an enlarged retaining portion 42 of rectangular cross-section adjacent the merger of the leg with the bight portion 34 of the terminal, and tapered guide surfaces 44 which provide a transition between the outer portion and the retaining portion. The short leg 38 of each terminal 32 is of rectangular cross-section and includes tapered guide surfaces 46 at a free end thereof. With further reference to FIG. 3, the bight portion 34 of each terminal 32 includes an enlarged planar rectangular section 48 having laterally projecting shoulders 50 each offset with respect to the remainder of the terminal a preselected distance whereby the shoulder facing the adjacent crystal resonator plate 30 produces a precise "free wire" length 51 of resonator lead between the body of the crystal resonator plate and the terminal when the resonator plate is mounted on the terminal.

The legs 36 and 38 of the terminals 32 are mounted in respective apertures 52 formed in the U-shaped first support portion 24 of the support member 22. In this connection, the square outer portions 40 (FIG. 3) of the long terminal legs 36 are readily receivable in the apertures 52 with a clearance fit, while the enlarged rectangular terminal retaining portions 42 and the short terminal legs 38 are received in the apertures with an interference fit to secure and retain the terminals 32 in the apertures. The reception of the legs 36 and 38 of each terminal 32 in their respective apertures 52 in this manner also precludes rotation of the terminal relative to the support member 22. In addition, the long legs 36 of the terminals 32 project beyond the opposite side of the support member 22 as shown in FIG. 2, and through and beyond the third crystal resonator device 16 (FIG. 1), for mounting the crystal network device 10 on the substrate 20 and electrically connecting the crystal network device to the above-mentioned circuits (not shown) on the substrate.

The crystal resonator plate 30 of the first crystal resonator device 12 is of elongated rectangular prismoidal construction and has had pairs of metallic (e.g., gold) electrodes 53 (only one electrode of each pair being shown) deposited on opposite sides thereof in a known manner, such as by sputtering or evaporation. A wire lead 54 also has been bonded, such as by soldering, to each of the metallic electrodes 53 so as to project outwardly therefrom. In mounting the resonator plate 30 on the support member 22, the resonator plate is disposed in a slot 56 formed in the support member between the first and second support portions 24 and 26 thereof such that outer end portions of the wire leads 54 rest on the planar rectangular bight portions 48 of the terminals 32 to support the resonator plate in the slot in spaced relationship to the support member. The outer end portions of the wire leads 54 then are bonded, such as by soldering, across enlarged flat surface of the enlarged terminal bight portions 48 as shown in FIGS. 1 and 3, such that the shoulders 50 of the bight portions facing the resonator plate 30 form the above-mentioned precise "free wire" lengths 51 (FIG. 3) of the wire leads between the body of the resonator plate and the terminals, as noted above. Preferably, as is known to those skilled in the art, the "free wire" length 51 is selected to be on the order of an odd multiple of one-quarter wave length of the wire leads 54, when the leads are resonant at the resonance frequency of the crystal resonator plate 30, to minimize the energy loss effect which improperly terminated wire leads 54 would have on the crystal resonator device 12. In this regard, the rectangular bight sections 48 also are made enlarged as shown to produce an enhanced vibration terminating effect on the wire leads 54.

As viewed in FIG. 2, the second support portion 26 of the support member 22 includes a pair of horizontally spaced and vertically offset lower and upper projecting lugs 58 and 60, respectively. The lower lug 58 has a vertically projecting cylindrical protrusion 62, with a suitably tapered (e.g., conical) tip, receivable with an interference fit in an aperture 64 in a projecting upper lug 66 of a support member 68 of the second crystal resonator device 14, for releasably interlocking the support members 22 and 68 of the first and second crystal resonator devices 12 and 14 together. Similarly, the upper lug 60 has an aperture 70 for receiving, with an interference fit, an identical cylindrical protrusion (not shown) of a lower lug 72 of the support member 68 of the second crystal resonator device 14. The U-shaped first support portion 24 of the support member 22 also has a guide tongue 74 formed along an inclined edge of the support portion for subsequent assembling of the first crystal resonator device 12 with the third crystal resonator device 16 (FIG. 4).

As is apparent from FIG. 2, the second crystal resonator device 14 is substantially identical to the first crystal resonator device 12, but of reversed construction. Thus, in addition to the upper and lower lugs 66 and 72 of the support member 68 for releasably interlocking the first and second crystal resonator devices 12 and 14 together, the support member 68 includes a U-shaped first support portion 76, a projecting shelf-type second support portion 80 having the upper and lower lugs 66 and 72 projecting therefrom, and an essentially planar, slightly tapered fin-like portion 82 projecting from the first support portion in protective relationship to an adjacent end of a crystal resonator plate 84 having a second resonant frequency. The crystal resonator plate 84 is fixedly mounted in a slot 86 in the support member 68 and on the enlarged wire terminating bight sections 48 of associated ones of the inverted J-shaped terminals 32 by respective wire leads 88 bonded to electrodes 89 of the plate.

Figure 4:
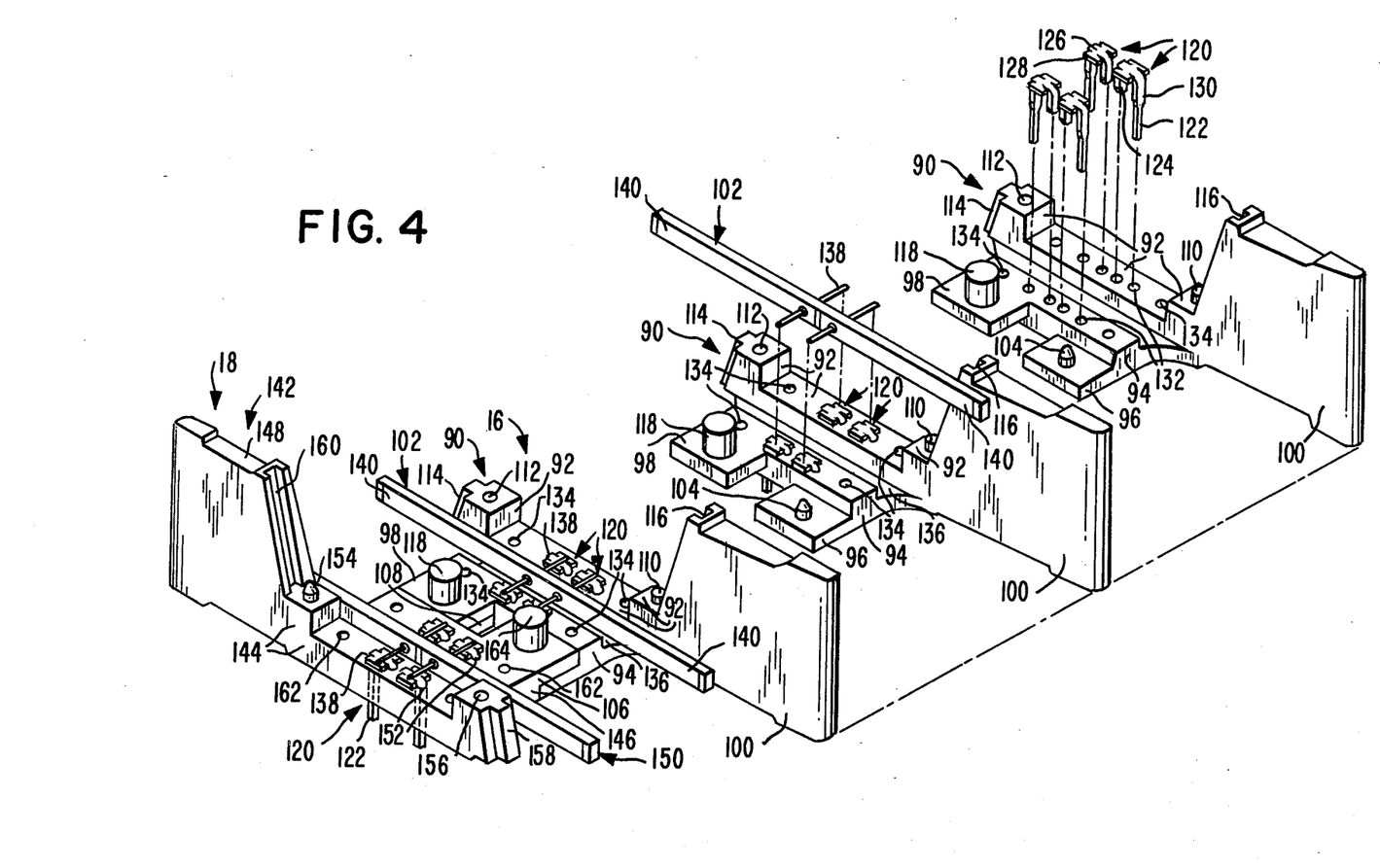
FIG. 4 is an isometric exploded view illustrating the assembly of a second set of crystal resonator devices in accordance with this invention.

Referring to FIG. 4, the third crystal resonator device 16 is similar in construction to the first crystal resonator device 12 as above-described. In this connection, the third crystal resonator device 16 includes a molded plastic support member 90 having an essentially U-shaped first support portion 92 which is of reduced height in comparison to the height of the U-shaped first support portion 24 of the first crystal resonator device 12, a projecting shelf-type second support portion 94 having projecting lower and upper lugs 96 and 98, and an essentially planar, slightly tapered fin-like portion 100 extending adjacent a crystal resonator plate 102 having a third resonant frequency, in protective relationship to one end of the plate. As in the case of the first crystal resonator device 12, the lower interlocking lug 96 includes a vertical cylindrical protrusion 104 receivable with an interference fit in an aperture (not shown) in an upper interlocking lug 106 of the fourth crystal resonator device 18, and the upper interlocking lug 98 includes an identical aperture (not shown) which receives, with an interference fit, a vertical cylindrical protrusion (not shown) on a lower interlocking lug 108 of the fourth crystal resonator device 18.

The first and third crystal resonator devices 12 and 16 are held assembled together as shown in FIG. 1, in part by a cylindrical protrusion 110 which has a suitably tapered tip. The cylindrical protrusion 110 projects from one leg of the U-shaped support portion 92 of the third crystal resonator device 16 and is receivable with an interference fit in an associated aperture (not shown) in the U-shaped support portion 24 (FIG. 2) of the first crystal resonator device 12. Similarly, an aperture 112 in another leg of the U-shaped support portion 92 forcibly receives an identical depending cylindrical protrusion (not shown) on the U-shaped support portion 24. A guide tongue 114 on the latter leg of the support portion 92 is received in a corresponding groove (not shown) of the support portion 24, and a groove 116 in an inclined edge of the fin-like portion 100 receives the tongue 74 of the support portion 24. In addition, the upper interlocking lug 98 of the third crystal resonator device includes an upwardly projecting cylindrical spacer lug 118 engageable with an opposed surface of the lower interlocking lug 58 of the first crystal resonator device 12 to help maintain the devices in a proper spaced relationship.

The third crystal resonator device 16 also includes pairs of inverted unitary J-shaped terminals 120 of essentially identical construction to the J-shaped terminals 32 of the first and second crystal resonator devices 12 and 14, but of reduced size. Thus, each terminal 120 includes a long leg 122 and a rectangular short leg 124 extending perpendicularly from opposite ends of an enlarged rectangular bight portion or section 126 having side shoulders 128. The rectangular short terminal legs 124 and enlarged rectangular portions 130 of the long terminal legs 122 are receivable with an interference fit in respective apertures 132 in the first and second support portions 92 and 94 of the support member 90, with the long legs projecting beyond a lower side of the support member for insertion in respective ones of the apertures 21 of the substrate 20 (FIG. 1) and mounting of the completed crystal network device 10 on the substrate. Further, the first and second support portions 92 and 94 include apertures 134 through which the long legs 36 (FIGS. 2 and 3) of the terminals 32 of the first crystal resonator device 12 extend with a clearance fit and in projecting relationship from the third crystal resonator device 16 when the devices are connected together. As in the case of the crystal resonator plates 30 and 84, the crystal resonator plate 102 is disposed in a slot 136 between the first and second support portions 92 and 94 of the support member 90, and is mounted on the support member by wire leads 138 projecting from electrodes 140 of the plate and bonded to the enlarged wire terminating bight sections 126 of the J-shaped terminals 120, with the shoulders 128 of the bight portions facing the plate defining "free wire" lengths of the leads, as illustrated in FIG. 2 by the free wire length 51.

As is apparent from FIG. 4, the fourth crystal resonator device 18 is substantially identical to the third crystal resonator device 16, but of reversed construction as viewed in this figure. Thus, the fourth crystal resonator device 18 includes a molded plastic support member 142 having an essentially U-shaped first support portion 144, a shelf-like second support portion 146 carrying the projecting upper and lower lugs 106 and 108, and an essentially planar, slightly tapered fin-like portion 148 extending in protective relationship to an adjacent end of a crystal resonator plate 150 having a fourth resonant frequency. As in the case of the support member 90 of the third crystal resonator device 16, the support member 142 has respective ones of the inverted J-shaped terminals 120 mounted in apertures 152 in the support portions 144 and 146, with the long legs 122 of the terminals projecting beyond the support member. The support member 142 includes an interlocking cylindrical protrusion 154, a protrusion-receiving aperture 156, a guide tongue 158 and a tongue-receiving groove 160, cooperable with associated elements of the support member 68 (FIG. 2) of the second crystal resonator device 14, namely, an aperture (not shown), an interlocking cylindrical protrusion (not shown), a guide groove (not shown) and the guide tongue 78 (FIG. 2), respectively, to retain these devices in proper assembled relationship. The support member 142 also includes apertures 162 through which the legs 36 of the terminals 32 of the second crystal resonator device 14 extend with a clearance fit to project from the support member, and the upper interlocking lug 106 of the support member includes a vertically projecting cylindrical spacer lug 164 for helping to maintain proper spacing of the fourth crystal resonator device 18 relative to the second crystal resonator device 14.

As noted hereinabove, each of the crystal resonator plates 30, 84, 140 and 150 is of a different resonant frequency and thus requires a different "free wire" length 51 (FIG. 3) of resonator lead between the plate and its respective terminals 30 or 120. In accordance with this invention, with reference to the terminals 32 by way of example, this variation in the "free wire" length of resonator lead is readily provided by varying the width of the rectangular bight sections 48 of the terminals when the terminals are fabricated, to vary the offset of the shoulders 50 with respect to the legs 36 and 38 of the terminals, depending upon the resonant frequency of the associated crystal resonator plate 30 or 84. In this manner the "free wire" length 51 of resonator lead readily can be varied as desired without changing the positions of the terminal leg-receiving apertures 52 (FIG. 2) in the support members 22 and 68, and the positions of the associated apertures 134 and 162 (FIG. 4) in the support blocks 90 and 142, respectively, for receiving the long legs 36 of the terminals 32. Thus, the same support members 22, 68, 90 and 142 are capable of universal use in their respective crystal resonator devices 12, 14, 16 and 18 regardless of the resonant frequency thereof.

Figure 5:
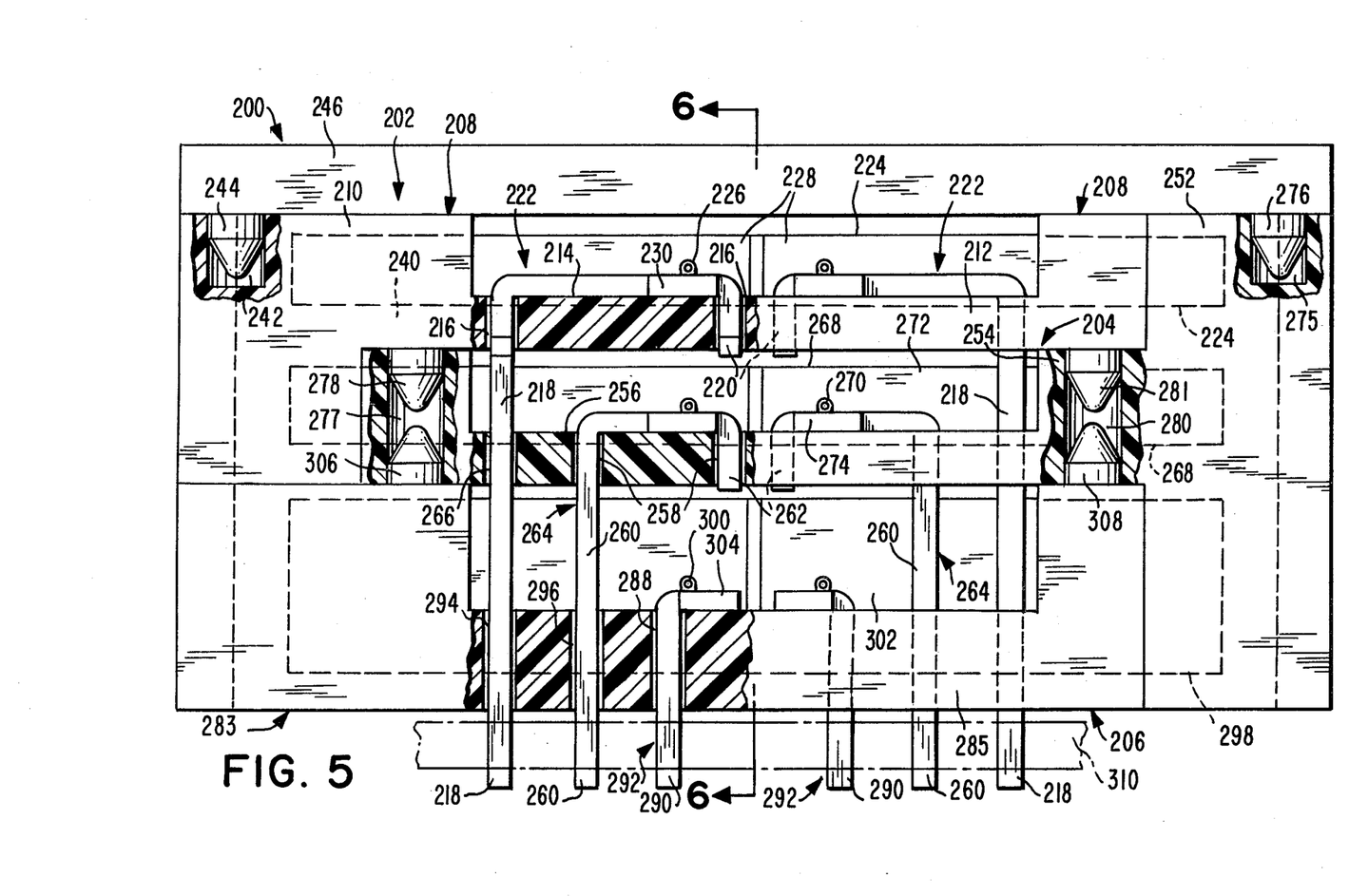
FIG. 5 is an elevational view of an alternate embodiment of a crystal network device in accordance with this invention.
Figure 6:
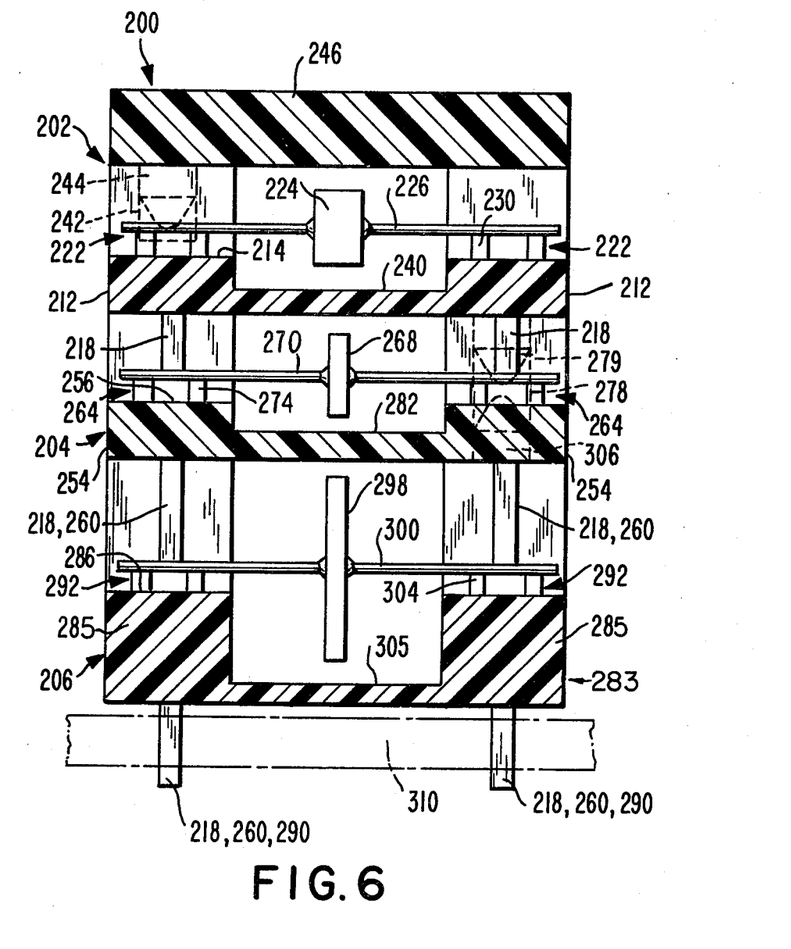
FIG. 6 is a cross-sectional view taken along the line 6—6 in FIG. 5.
Figure 7:
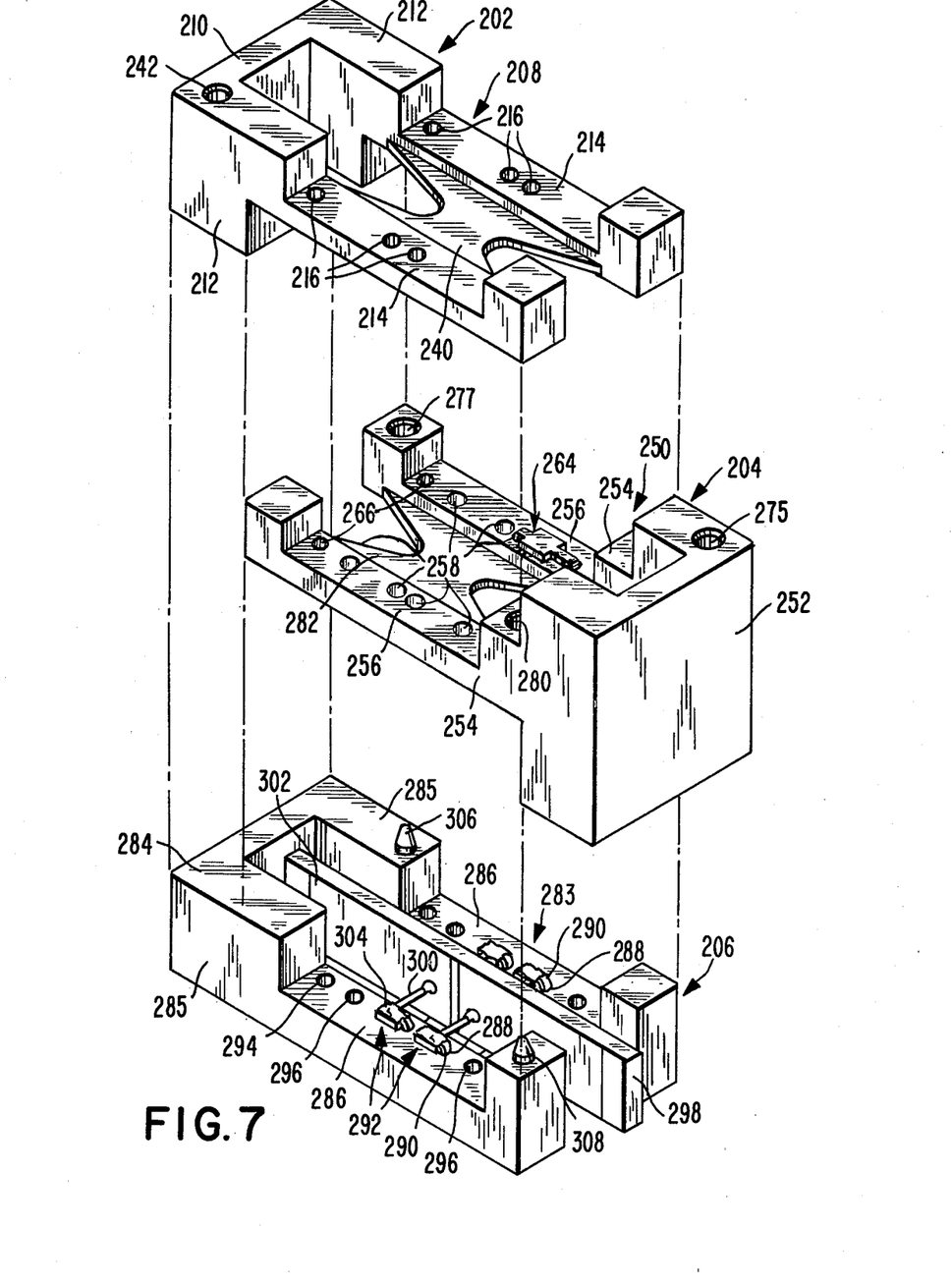
FIG. 7 is an exploded isometric view of the crystal network device shown in FIGS. 5 and 6.

FIGS. 5–7 disclose an alternate embodiment of the invention in which a crystal network device 200 includes three separable crystal resonator devices 202, 204 and 206 of different resonant frequencies. In the crystal network device 200, the three crystal resonator devices 202, 204 and 206 are stacked one upon the other in a vertical array, as is best shown in FIG. 6.

The first or upper crystal resonator device 202 includes a generally U-shaped support block 208 (best shown in FIG. 7) of a molded plastic material having a base portion 210 and a pair of spaced legs 212 projecting from opposite ends of the base portion. Intermediate depressed seat portions 214 of the legs 212 are provided with spaced apertures 216 in which long legs 218 (FIG. 5) and short legs 220 (FIG. 5) of inverted J-shaped terminals 222 (FIG. 5), which are identical in construction to the J-shaped terminals 32 shown in FIG. 3, are mounted with an interference fit. A crystal resonator plate 224 having a relatively low resonant frequency is supported between the legs 212 of the support block 208 by lead wires 226 extending from electrodes 228 of the plate and bonded to enlarged wire terminating bight sections 230 of the J-shaped terminals 222, as described hereinabove with reference to the crystal network device 10 of FIGS. 1-4. The legs 212 of the U-shaped support block 208 are reinforced by a web 240 extending therebetween. As viewed in FIG. 7, a left-hand corner of the base portion 210 includes an aperture 242 which receives a conically-tipped cylindrical protrusion 244 (best shown in FIG. 5) on a cover plate 246 (FIGS. 5 and 6) with an interference fit to retain the cover plate on the support block 208.

Similarly, the second or middle crystal network device 204 also includes a molded plastic U-shaped support block 250 (best shown in FIG. 7) having an enlarged base portion 252 and a pair of spaced legs 254 projecting from opposite ends of the base portion. As in the case of the support block 208 of the upper crystal resonator device 202, the legs 254 of the support block 250 include depressed intermediate seat portions 256 having apertures 258 formed therethrough for forcibly receiving long legs 260 and short legs 262 of inverted J-shaped terminals 264. The J-shaped terminals 264 are of the same construction as the J-shaped terminals 222, but reduced in size, as is best shown in FIG. 5. The intermediate seat portions 256 also include apertures 266 through which the long legs 218 of the terminals 222 extend with a clearance fit. A crystal resonator plate 268 having an intermediate frequency is supported between the legs 254 of the support block 250 by lead wires 270 extending from electrodes 272 of the plate and bonded to enlarged wire terminating bight sections 274 of the terminals 264. An upper right-hand corner of the support block 250, as viewed in FIG. 7, includes an aperture 275 for receiving another conically-tipped cylindrical protrusion 276 (best shown in FIG. 5) on the cover plate 246 with an interference fit. Similarly, a free end of one of the support block legs 254 includes an aperture 277 which receives a conically-tipped cylindrical protrusion 278 (best shown in FIG. 5) on the adjacent leg 212 of the upper support block 208. The other support block leg 254 includes an aperture 280 which receives a conically-tipped cylindrical protrusion 281 (best shown in FIG. 5) on the second leg 212 of the upper support block 208 with an interference fit. The legs 254 of the support block 250 are reinforced by a web 282 extending therebetween.

As is best shown in FIG. 7, a third or lower crystal resonator device 206 also includes a molded plastic U-shaped support block 283 having a base portion 284 and a pair of legs 285 extending from opposite sides of the base portion. As in the support blocks 208 and 250 of the upper and intermediate crystal resonator devices 202 and 204, the legs 285 of the support block 283 include intermediate depressed seat portions 286 having apertures 288 therein for receiving legs 290 of terminals 292 with an interference fit. The terminals 292 are similar in construction to the J-shaped terminals 222 and 264 except that short legs of the terminals 292 have been omitted in this instance to conserve space. The intermediate seat portions 286 also include apertures 294 and 296 through which the long legs 218 and 260 of the J-shaped terminals 222 and 264 of the upper and intermediate crystal resonator devices 202 and 204 extend, respectively, with a clearance fit. A crystal resonator plate 298 having a relatively high resonant frequency is supported between the legs 285 of the support block 283 by lead wires 300 extending from electrodes 302 of the plate and bonded to enlarged wire terminating sections 304 of the terminals 292. The legs 285 of the support block 283, which are interconnected by a web 305 (FIG. 6), also include upstanding conically-tipped cylindrical protrusions 306 and 308, respectively, receivable with an interference fit in the apertures 277 and 280 in respective ones of the legs 254 of the support block 250 of the intermediate crystal resonator device 204, to retain the support blocks in assembled relationship. As is shown in FIGS. 5 and 6, the long legs 218 and 260 of the J-shaped terminals 222 and 264, and the legs 290 of the terminals 292, project beyond the support block 283 for mounting the crystal network device 200 on a substrate, such as a printed circuit board 310, and for electrically connecting the device to circuits (not shown) on the board.

The support blocks 22, 68, 90, 142, 208, 250 and 283 of the crystal network devices 10 and 200 may be formed of any suitable molded plastic, as for example, a 40% glass-filled polyphenylene sulfide resin available from the Phillips Chemical Company of Houston, Tex. under the trademark "Ryton." Further, the terminals 32, 120, 222, 264 and 292 may be fabricated from a solder-coated phosphor bronze strip in a progressive punch-and-die in a manner known to those skilled in the art.

In summary, a new and improved crystal network device, such as the crystal network device 10, has been disclosed wherein the device includes a plurality of crystal resonator devices 12, 14, 16 and 18 which can readily be assembled to one another after having been tuned to respective desired final resonant frequencies. In addition, the crystal resonator devices 12, 14, 16 and 18 can readily be separated from one another, if necessary, such as for replacement purposes.

In this connection, the crystal resonator devices 12, 14, 16 and 18 include respective interlocking molded plastic support members 22, 68, 90 and 142, which carry respective crystal resonator plates 30, 84, 102 and 150. The crystal resonator plates 30, 84, 102 and 150 are supported on their respective support members 22, 68, 90 and 142 by the wire leads 54 or 138 being bonded directly to the enlarged wire terminating rectangular bight sections 48 or 126 of the J-shaped terminals 32 or 120, which have been fabricated so that the bight section shoulders 50 or 128 facing the plates define a precise "free wire" length 51 (FIG. 3) of the wire leads on the order of an odd multiple of one-quarter wave length of the leads, when the leads are resonant at the resonant frequency of their respective crystal resonator plates.

The J-shaped terminals 32 and 120 are securely retained in their respective support members 22, 68, 90 and 142 as a result of the rectangular portions 42 and 130 of the long terminal legs 36 and 122, respectively, and the rectangular short terminal legs 38 and 124, respectively, being forcibly received in the support members. In addition, the long legs 36 of the terminals 32 extend through and beyond the underlying support members 90 and 142, and the long legs 122 of the terminals 120 project beyond the support members 90 and 142, for reception in the apertures 21 in the printed circuit board 20, and thus mounting of the crystal network device 10 on the board and connecting of the crystal network device to the circuits (not shown) thereon.

Similarly, the crystal network device 200 includes the separable crystal resonator devices 202, 204 and 206 of relatively low, intermediate and relatively high resonant frequencies, respectively. The crystal resonator devices 202, 204 and 206 include respective interlocking molded plastic support blocks 208, 250 and 283, which carry respective crystal resonator plates 224, 268 and 298. The crystal resonator plates 224, 268 and 298 are supported on their respective support blocks 208, 250 and 283 by the wire leads 226, 270 and 300 being soldered directly to the enlarged wire terminating sections 230, 274 and 304 of the terminals 222, 264 and 292, respectively, so as to define a precise "free wire" length of the leads as described hereinabove. The terminals 222, 264 and 292 are retained in their respective support blocks 208, 250 and 283 by being force-fitted therein, and legs 218, 260 and 290 of the terminals project beyond the lower support block 283 for mounting the crystal network device 200 on the printed circuit board 310 and connecting the device to circuits (not shown) of the board.

What is claimed is:

1. A crystal network device, which comprises:
    an assembly of separable interconnected support members of electrical insulating material;
    a plurality of unitary electrical terminals mounted on each of the support members, each terminal including a terminal portion which projects beyond the assembly of interconnected support members adjacent one side of the assembly;
    a crystal resonator plate for each of the support members; and
    lead wires extending from each of the crystal resonator plates and fixedly bonded to respective ones of the unitary terminals mounted on the support member for the crystal resonator plate.

2. A crystal network device as recited in claim 1, in which:
    the unitary terminals mounted on at least one of the interconnected support members also extend through apertures in an adjacent one of the interconnected support members.

3. A crystal network device as recited in claim 1, in which:
    the terminals each include at least one leg mounted in a respective one of the support members and an enlarged wire terminating section, the lead wires being bonded to the enlarged wire terminating sections of the terminals.

4. A crystal network device as recited in claim 1, in which:
    certain of the terminals include a bight portion and legs projecting essentially perpendicularly from respective opposite ends of the bight portion, portions of the legs being mounted in the support members and the lead wires being fixedly bonded to the terminal bight portions.

5. A crystal network device as recited in claim 4, in which:
    certain of the terminals are of an essentially J-shaped construction with one of the legs being longer than the other leg and projecting from the assembly of interconnected support members.

6. A crystal network device as recited in claim 4, in which:
    the lead wires of each crystal resonator plate are bonded to enlarged wire terminating sections of their respective terminal bight portions with each wire terminating section having a shoulder spaced from the crystal resonator plate a distance on the order of an odd multiple of one-quarter wave length of the lead, when the lead is resonant at the resonant frequency of the crystal resonator plate.

7. A crystal resonator device, which comprises:
    a support member of electrical insulating material;
    a plurality of unitary electrical terminals mounted on the support member, each terminal including a terminal portion which projects beyond the support member;
    a crystal resonator plate;
    lead wires extending from the crystal resonator plate and fixedly bonded to respective ones of the unitary terminals; and
    means on the support member for releasably interlocking the support member with support members of other crystal resonator devices.

8. A crystal network device, which comprises:
    an assembly of molded plastic support members, each of the support members including a first support portion, a second support portion projecting perpendicularly from the first support portion in a first direction, and an essentially planar protective fin portion projecting from the first support portion in a second direction perpendicular to the first direction;
    interlocking means on the first and second support portions of the support members for releasably interconnecting the support members together;
    a plurality of essentially J-shaped terminals each having a bight portion, a relatively long leg projecting from one end of the bight portion and a relatively short leg projecting from the opposite end of the bight portion, the legs of the terminals being disposed in apertures in respective ones of the support portions of the support members with the long legs of certain of the terminals extending through apertures in other support portions of the support members, and with the long legs of the terminals projecting beyond the assembly of interconnected support members adjacent one side of the assembly;

a plurality of crystal resonator plates, one for each of the support members; and lead wires fixedly connected to the crystal resonator plates and the bight portions of the J-shaped terminals to support the resonator plates on the terminals.

9. A unitary electrical terminal which comprises:
a bight portion;
a long leg projecting from one end of the bight portion;
a short leg projecting from an opposite end of the bight portion; and
an enlarged planar section integral with the bight portion and defining a laterally projecting shoulder offset with respect to the remainder of the terminal.

10. A unitary electrical terminal as recited in claim 9, in which:
the long leg of the terminal includes a first portion adjacent the merger of the leg with the bight portion and includes a second outer free end portion, the first portion of the long leg being enlarged with respect to the outer free end portion.

11. A unitary electrical terminal as recited in claim 9, in which:
the enlarged planar section further defines a second laterally projecting shoulder offset with respect to the remainder of the terminal on an opposite side of the enlarged planar section from a side thereof on which the first laterally projecting shoulder is located.

12. A crystal resonator device, which comprises:
a support member of electrical insulating material;
a plurality of unitary electrical terminals mounted on the support member, each terminal including an enlarged wire terminating section having an enlarged flat surface and a shoulder at one side of the flat surface, and each terminal also including at least one leg mounted in the support member and projecting beyond the support member;
a crystal resonator plate; and
lead wires extending from the crystal resonator plate and fixedly bonded across the enlarged flat surfaces of the enlarged wire terminating sections of respective ones of the unitary terminals with preselected free lengths of the lead wires extending between the crystal resonator plate and respective ones of the shoulders on the enlarged wire terminating sections.

13. A crystal resonator device, which comprises:
a support member of electrical insulating material;
a plurality of unitary electrical terminals mounted on the support member, certain of the terminals including a bight portion and legs projecting perpendicularly from opposite ends of the bight portion, and portions of the legs being mounted in the support member with certain of the legs projecting beyond the support member;
a crystal resonator plate; and
lead wires extending from the crystal resonator plate and fixedly bonded to respective ones of the terminal bight portions.

14. A crystal resonator device as recited in claim 13, in which:
certain of the terminals are of an essentially J-shaped construction with one of the legs being longer than the other leg and projecting from the support member.

15. A crystal resonator device as recited in claim 13, in which:
the lead wires of the crystal resonator plate are bonded to enlarged wire terminating bight sections of their respective terminals with each wire terminating section having a shoulder spaced from the crystal resonator plate a distance on the order of an odd multiple of one-quarter wave length of the lead, when the lead is resonant at the resonant frequency of the crystal resonator plate.

16. A crystal resonator device, which comprises: a support member of electrical insulating material, the support member including a first U-shaped support portion and a second shelf-type support portion projecting laterally from the U-shaped support portion, and the U-shaped support portion and the shelf-type support portion each having terminal-receiving apertures formed therein;
a plurality of unitary electrical terminals mounted in the terminal-receiving apertures of the U-shaped support portion and the shelf-type support portion of the support member, each terminal including a terminal portion which projects beyond the support member;
a crystal resonator plate; and
lead wires extending from the crystal resonator plate and fixedly bonded to respective ones of the unitary terminals.

17. A crystal resonator device as recited in claim 16, in which:
the support member includes a slot formed between the U-shaped support portion and the second shelf-type support portion, with the crystal resonator plate being disposed in the slot.

18. A crystal resonator device as recited in claim 16, in which:
the support member further includes an essentially planar fin portion projecting from the U-shaped support portion parallel to the crystal resonator plate in protective relationship to the crystal resonator plate.

* * * * *